(12) United States Patent
Yeom

(10) Patent No.: US 6,366,487 B1
(45) Date of Patent: Apr. 2, 2002

(54) PLURALITY OF INTEGRATED CIRCUIT CHIPS

(75) Inventor: Jin-Seon Yeom, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/474,880

(22) Filed: Dec. 29, 1999

(30) Foreign Application Priority Data

Dec. 30, 1998 (KR) ............................................. 98-62262

(51) Int. Cl.[7] ................................................ G11C 7/02
(52) U.S. Cl. .......................................... 365/52; 365/226
(58) Field of Search .............................. 365/51, 52, 63, 365/226; 326/38

(56) References Cited

U.S. PATENT DOCUMENTS

| 5,303,180 A | * | 4/1994 | McAdams ..................... 365/51 |
| 5,768,173 A | * | 6/1998 | Seo et al. ...................... 365/52 |
| 5,835,395 A | * | 11/1998 | Schreck et al. ................ 365/51 |
| 6,034,539 A | * | 3/2000 | Hwang ........................ 326/38 |

* cited by examiner

*Primary Examiner*—Trong Phan
(74) *Attorney, Agent, or Firm*—Marger Johnson & McCollom, P.C.

(57) ABSTRACT

A package according to the invention comprises at least two integrated circuit (IC) chips encapsulated therein. Each of the IC chips has its option pad, and the option pads of the IC chips are biased, at the package level, to different logic levels so as to distinguish between the IC chips. Particularly, the chips of the present invention have identical address coding scheme and are each comprised of a memory cell array for storing data; a command register for activating one of master signals each indicative of a read mode, a program mode and an erase mode in response to an externally applied command; and a chip disable circuit coupled to a corresponding option pad, for determining whether or not a corresponding semiconductor memory device is selected, and for resetting the command register so as to disable the activated master signal when the corresponding semiconductor memory device is unselected.

13 Claims, 6 Drawing Sheets

PLURALITY OF INTEGRATED CIRCUIT CHIPS

FIELD OF THE INVENTION

The present invention relates to semiconductor integrated circuit devices and more particularly to a semiconductor package that encapsulates at least two integrated circuit chips therein.

BACKGROUND OF THE INVENTION

There have been increasing needs for electrically programmable and erasable semiconductor memory devices that do not require refresh. Particularly, semiconductor memory devices, capable of storing a large amount of data, and capable of rewriting the stored data, has been developed. For example, a NAND-structured flash memory device has been proposed wherein a plurality of memory cells (EEPROM cells) are connected serially. Such a NAND-structured flash memory device is illustrated in cross-section and schematically by FIGS. 11.58 and 11.59 from a handbook by B. Price et al., entitled Semiconductor Memories, John Wiley & Sons Ltd., pp.603–604 (1991).

The NAND-structured flash memory device, however, has a drawback in that it is difficult to perform high-speed read operations because of its cell structure. But, the memory device has the advantages of less power consumption and good program/erase cycling endurance characteristics. Therefore, the NAND-structured flash memory device has been employed as a data storage medium, for example, a CD voice/audio recorder, a digital still camera, and a memory card used in a portable computer.

To meet ever increasing needs for such flash memory applications, a tighter design layout rule is required. Also, packaging of multiple semiconductor integrated circuit memory devices (chips or dies) of the same type in a single semiconductor package has been proposed so that the capacity of a NAND-structured flash memory device can be increased. One of such semiconductor packages is a dual-chip package (DCP).

Referring to FIG. 1, a conventional dual-chip package 100 has multiple pins, for example, nREx (read enable), nWEx (write enable), nCEx (chip enable), CLEx (command latch enable), ALEx (address latch enable), and data input/output IO0–IO7. Package 100 contains two semiconductor integrated circuit chips 110 and 120, which are encapsulated within the typically lidded and hermetically sealed dual-chip package 100. Each of the chips 110 and 120 has pads (or bonding pads) arranged so as to correspond to the pins of the dual-chip package 100. As illustrated in FIG. 1, the pads of each of the chips 110 and 120 are bonded to corresponding pins of the package 100. For example, the pin nREx is coupled in common to a corresponding pad of each of the chips 110 and 120. Similarly, other pins of the package 100 are coupled in common to corresponding pads of each of the chips 110 and 120.

FIG. 2 shows the internal architecture of chip 110 embodying a flash memory device. Chip 110 (hereinafter, refer to as the "LSB chip") comprises a memory cell array 210, a row decoder (X-DEC) circuit 220, a page buffer circuit 230, a column pass gating (Y-Gating) circuit 240, an I/O buffer circuit 250, an output driver circuit 260, a global buffer circuit 270, a command register 280, a control logic and high voltage generator 290, and an X/Y-counter and pre-decoder circuit 300. As seen from FIGS. 1 and 2, pads of chip 110 serve as the ports for address and data input/output as well as command inputs. Chip 120 (hereinafter, referred to as the "MSB chip") is configured the same as the LSB chip 110. The operation of chips 110 and 120 is well-known and will not be described herein.

The conventional dual-chip package 100 of FIG. 1 has twice the capacity of either of the memory chips 110 and 120 encapsulated therein. If each of the chips 110 and 120 is a 64 Mbit-memory device, the capacity of the dual-chip package 100 is 128 Mbit. Therefore, the dual-chip package has a 128 Mbit-pin layout or pinout configuration. Because two memory devices (chips) 110 and 120 are encapsulated in a single package 100, one of the devices performs its normal operation while the other is idle. If the two devices 110 and 120 were to operate at the same time, proper operation of the dual-chip package 100 cannot be ensured. This is because the input/output pads of the devices 110 and 120 are coupled in common to a single set of input/output pins IO0–IO7. In other words, to ensure the normal operation of dual-chip package 100, the chips 110 and 120 encapsulated therein must operate individually. That is, when one of the chips 110 or 120 is selected (or enabled), the other must be unselected (or disabled).

Memory devices 110 and 120 encapsulated in the dual-chip package 100 are distinguishable as the LSB chip and the MSB chip via different addresses (i.e. the devices have a different address coding scheme relative to each other). When the address is provided in common to the memory devices 110 and 120, one of the memory devices 110 and 120 is selected and the other is not selected. As a result, the LSB and MSB chips 110 and 120 must be manufactured by two different processes so that they operate properly when integrated into a common package.

Typically, when such LSB and MSB chips requiring different address-coding schemes are to be packaged together, different bonding procedures are used so that one of the chips has its pads bonded to a first set of pins on the wafer and the other has its pads bonded to a second set of pins on the wafer. Such special and differential processing during packaging is time consuming and costly.

SUMMARY OF THE INVENTION

It is therefore an object of the present invention to provide an improved package for encapsulating two IC chips, thereby saving time and money.

In order to attain the above objects, according to an aspect of the present invention, there is provided a package having a plurality of pins. The package comprises a first integrated circuit chip having pads corresponding to the pins, and a second integrated circuit chip having pads corresponding to the pins. The first and second integrated circuit chips each have an option pad. And, the first and second integrated circuit chips comprise semiconductor memory devices having the very same address coding schemes, each having an identical memory cell array for storing data; command register for activating one of master signals each indicative of a read mode, program or erase mode in response to an externally applied command; and chip disable circuit coupled to a corresponding option pad. The chip disable circuit including the option pad is provided in accordance with the invention for determining whether or not a corresponding semiconductor memory device is selected. The chip disable circuit resets the command register to disable the activated master signal when the corresponding semiconductor memory device is deselected. The option pad of one of the first and second integrated circuit chips, at a package level, is bonded to a pin supplying a power supply voltage and the option pad of the other thereof, at the package level, is bonded to a pin supplying a ground voltage.

In this embodiment, the chip disable circuit of each of the first and second integrated circuit chips comprises a select signal generator coupled to a corresponding option pad, for generating a chip select signal in response to a voltage signal at the corresponding option pad and to a MSB address signal from outside the chip. The chip select signal indicates whether a corresponding integrated circuit chip is selected or not. A mode reset circuit generates a mode reset pulse signal in response to the chip select signal and the activated master signal so that the command register is reset.

In this embodiment, the semiconductor memory device corresponding to each of the integrated circuit chips further comprises a data input/output buffer circuit which inputs data to be programmed in the memory cell array and outputs data read out from the memory cell array, the data input/output buffer circuit being disabled by a corresponding chip select signal when a corresponding semiconductor memory device is unselected.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

The preferred embodiments according to the present invention will be more fully described below with reference to the accompanying drawings.

Figure 1:
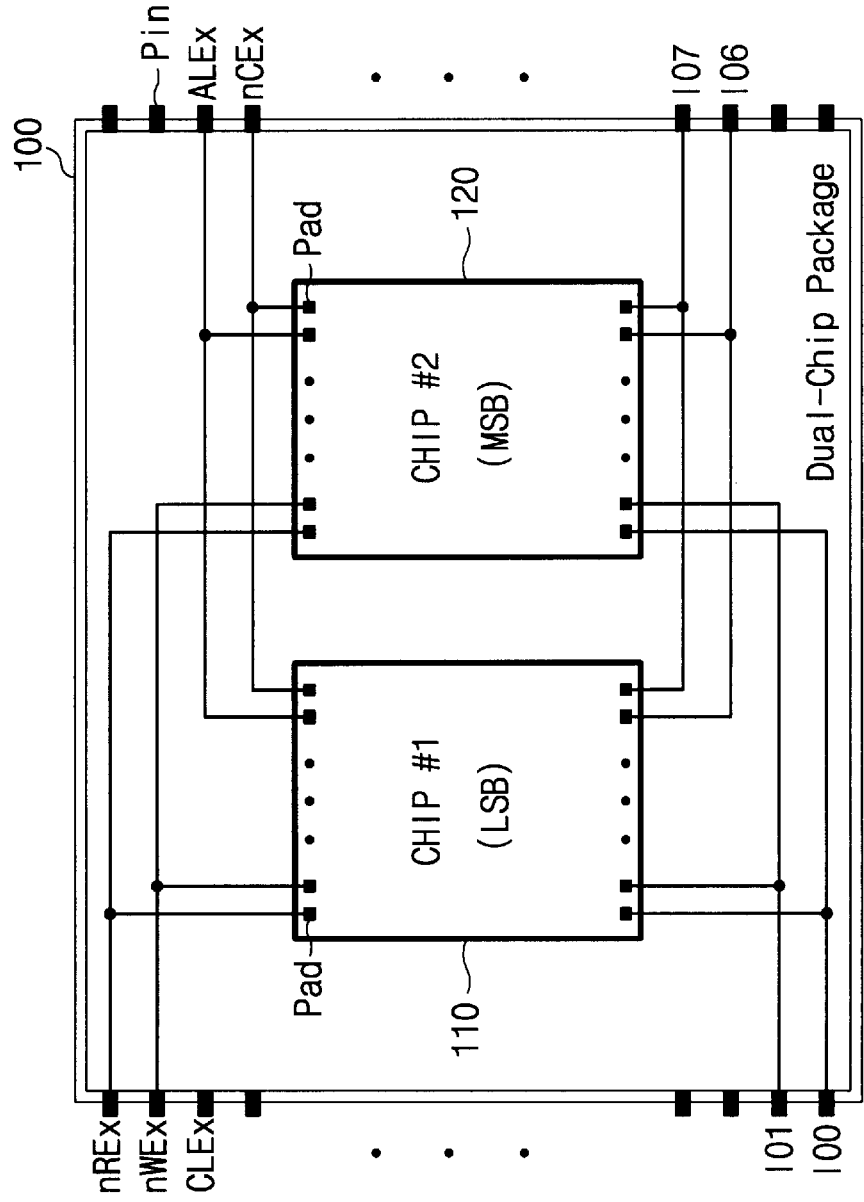
FIG. 1 is a block diagram of a conventional dual-chip package.
Figure 3:
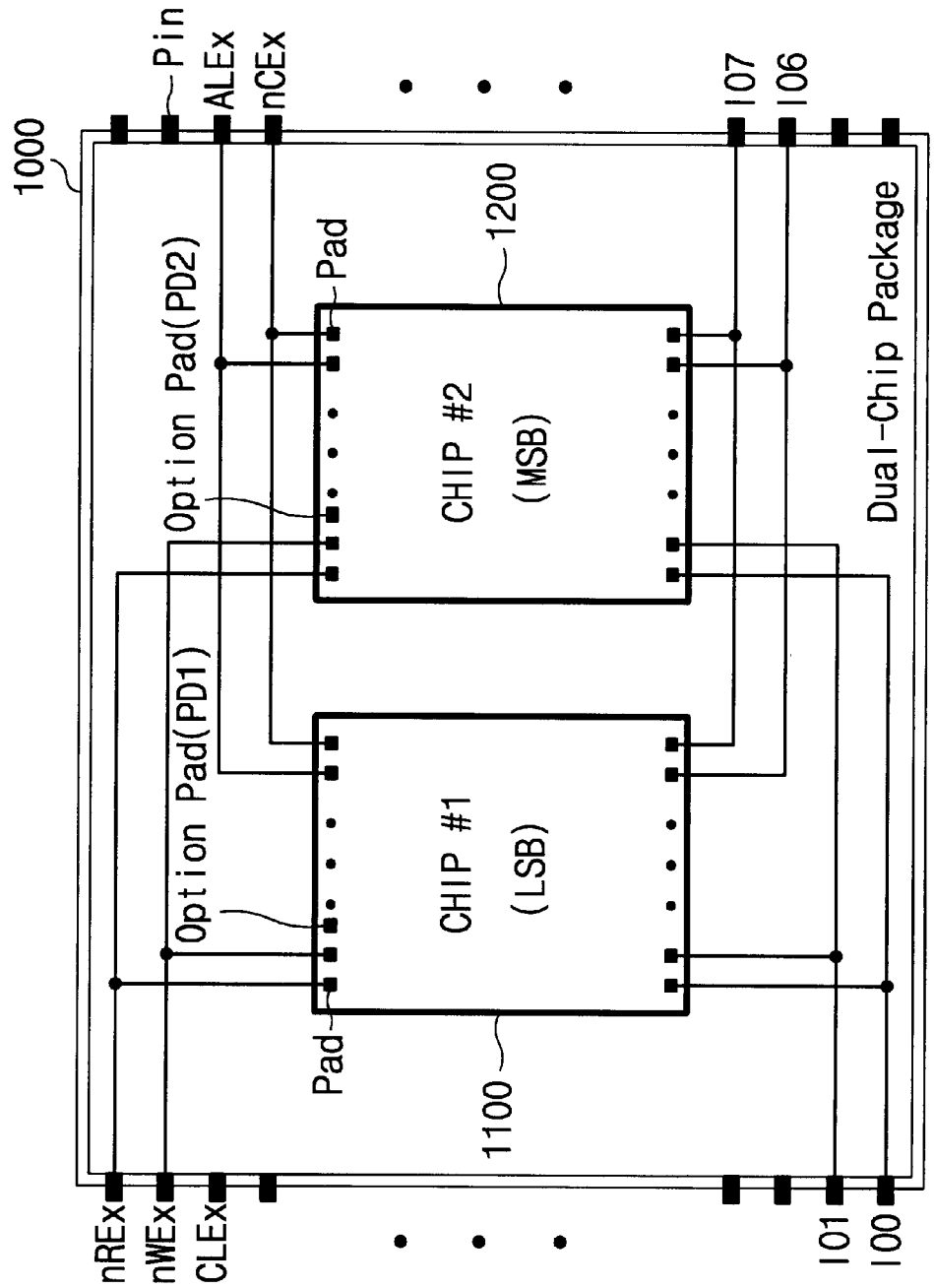
FIG. 3 is a layout diagram of a dual-chip package according to the present invention.

FIG. 3 is a layout diagram of a dual-chip package according to the present invention. In FIG. 3, the dual-chip package 1000 differs from package 100 of FIG. 1 in that the chips 1100 and 1200 encapsulated therein are provided with option pads PD1 and PD2, respectively. The option pad PD1 of LSB chip 1100 and the option pad PD2 of the MSB chip 1200 are designed to have complementary (i.e. one high and the other low) voltage signals applied to them. The LSB and MSB chips 1100 and 1200 contain a semiconductor memory device (for example, a NAND-structured flash memory device) of exactly the same type. For example, the chips 1100 and 1200 each have the same pad layout, capacity and address-coding scheme. This means that, after they are fabricated on the same wafer, the LSB and MSB chips 1100 and 1200 are distinguished from one another at the package level by applying complementary voltage signals to the option pads PD1 and PD2. Therefore, packaging of the LSB and MSB chips is greatly simplified.

Figure 2:
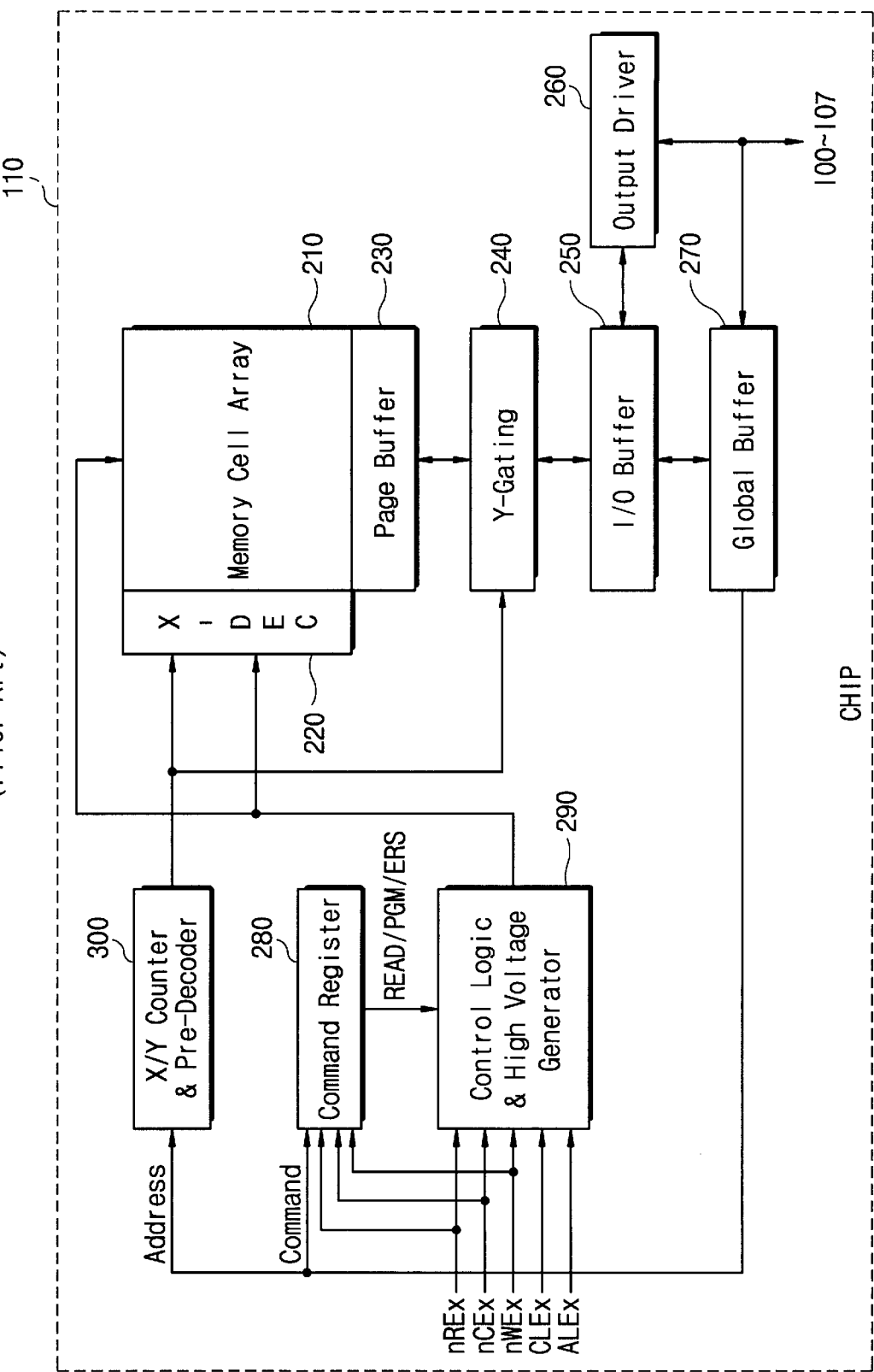
FIG. 2 shows a conventional flash memory device corresponding to one of the semiconductor integrated circuit chips of FIG. 1.
Figure 4:
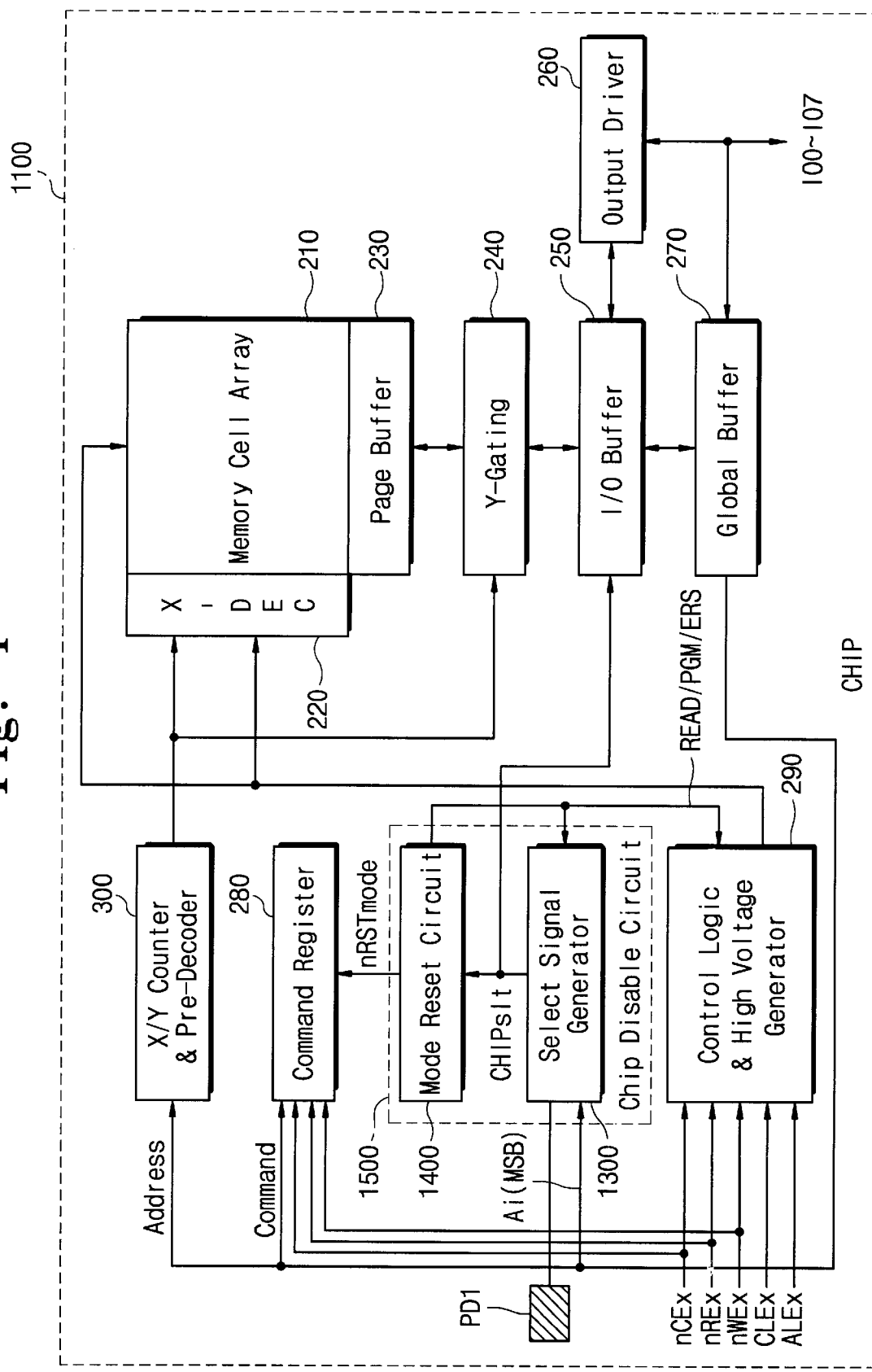
FIG. 4 shows a layout diagram of a flash memory device corresponding to one of the semiconductor integrated circuit chips of FIG. 3 according to a first embodiment of the present invention.

Referring to FIG. 4, the LSB chip 1100, a flash memory device, according to a first preferred embodiment of the present invention is illustrated. The flash memory device 1100 of the invention is identical to device 110 of FIG. 2 except that a chip disable circuit 1500 is provided. Chip disable circuit 1500 comprises a select signal generator 1300 and a mode reset circuit 1400. The constituent components that are identical to those of FIG. 2 are labeled with the same reference numbers, and description thereof is thus omitted. The flash memory device corresponding to the MSB chip 1200 is configured similarly to LSB chip 1100.

In the first embodiment, the option pad PD1 of the LSB chip 1100 may be coupled to a package pin receiving a ground voltage, and the option pad PD2 of the MSB chip 1200 may be coupled to a package pin receiving a power supply voltage. Alternatively, the option pad PD1 of the LSB chip 1100 can be coupled to a package pin receiving the power supply voltage, and the option pad PD2 of the MSB chip 1200 can be coupled to a package pin receiving the ground voltage.

Chip disable circuit 1500 is coupled to the option pad PD1. Circuit 1500 responds to a voltage level on the option pad PD1 and a most significant bit (MSB) address signal Ai (where i is a positive integer) to determine whether or not a corresponding memory device is selected. When the device is unselected, the chip disable circuit 1500 disables the corresponding memory device even if the chip enable signal nCEx is activated. Such an operation of the chip disable circuit 1500 will be more fully described below.

First, the select signal generator 1300 of the chip disable circuit 1500 is coupled to the option pad PD1, and generates a select signal CHIPslt in response to the voltage or logic levels of the option pad PD1 and the MSB address signal Ai.

Figure 5:
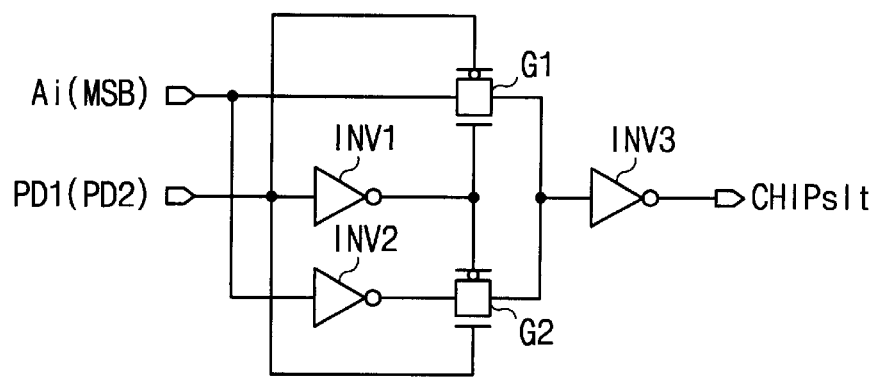
FIG. 5 is a preferred embodiment of a select signal generator of FIG. 4.

Turning briefly to FIG. 5, a preferred embodiment of the select signal generator 1300 is illustrated in FIG. 5. The select signal generator 1400 comprises three invertors INV1, INV2 and INV3 and two transfer gates G1 and G2 connected as illustrated in FIG. 5. When the voltage level of the option pad PD1 is at a logic low level e.g. (ground), the MSB address signal Ai is outputted as the select signal CHIPslt through the transfer gate G1 and the inventor INV3. That is, the MSB address signal Ai is inverted, and the signal thus inverted is then outputted as the select signal CHIPslt. Preferably the memory device is selected when the select signal CHIPslt is at a logic high level. Assume option pad PD1 is coupled to a ground voltage and the option pad PD2 is coupled to a power supply voltage. Now, when the MSB address signal Ai is at a logic low level, the LSB chip 1100 is selected and the MSB chip 1200 is unselected. Logic levels of the select signal CHIPslt according to the voltage signal of the option pad and the MSB address signal are summarized as follows.

TABLE 1

| PD1 (2) | A (i) | CHIPslt |
|---------|-------|---------|
| "L"     | "H"   | "L"     |
|         | "L"   | "H"     |
| "H"     | "H"   | "H"     |
|         | "L"   | "L"     |

In this embodiment, when the select signal CHIPslt is at a logic low level, that is, when the memory device is unselected, the data input/output buffer circuit 250 is inactivated by the select signal CHIPslt.

Referring again to FIG. 4, the mode reset circuit 1400 generates a mode reset pulse signal nRSTmode when the select signal CHIPslt is at a logic low pulse level. In other words, when the memory device is disabled (or unselected), the mode reset circuit 1400 corresponding to the disabled memory device generates a mode reset signal nRSTmode of the pulse form. When the mode reset signal nRSTmode is pulsed, the command register 280 is reset so that a master signal READ/PGM/ERS indicative of a program, read, or erase mode becomes inactive.

Figure 6:
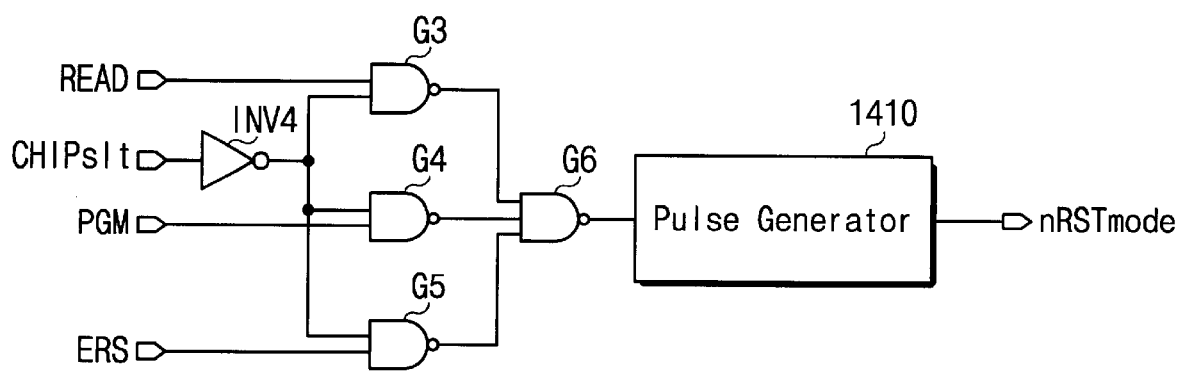
FIG. 6 is a preferred embodiment of a mode reset circuit of FIG. 4.

Turning now briefly to FIG. 6, it may be seen that the mode reset circuit 1400 is composed of four NAND gates G3~G6, an invertor INV4, and a pulse generator 1410 connected as illustrated in FIG. 6.

When the select signal CHIPslt is at a logic high level, an output signal from the NAND gate G6 is maintained logic low since output signals from the NAND gates G3, G4 and G5 become logic high regardless of the logic states of the master signals READ, PGM and ERS. At this time, the mode reset signal nRSTmode is not pulsed. When the select signal CHIPslt is at a logic low level, the output signal from the NAND gate G6 transitions from logic low to logic high since either one of the output signals from the NAND gates G3, G4 and G5 becomes logic low in accordance with the logic states of the master signals READ, PGM, and ERS. At this time, the mode reset signal nRSTmode is pulsed, so that the command register 280 (FIG. 4) is reset so as to disable an activated master signal corresponding to the read, program or erase mode., Referring collectively now to FIG. 5 through FIG. 6, a read operation of the dual-chip package according to the first embodiment will be more fully described. Assume that the option pad PD1 of the LSB chip 1100 is coupled to a package pin supplying the power supply voltage and the option pad PD2 of the MSB chip 1200 is coupled to a package pin supplying the ground voltage.

When the read operation is initiated, read command is loaded to the command register 280 via the global buffer circuit 270 and an X/Y-address is loaded to the X/Y-counter & pre-decoder circuit 300 via the global buffer circuit 270. The command register 280 used as well-known mode register set activates the master signal READ indicative of the read mode in response to the read command. If the MSB address signal Ai of the address is at a logic low level, the chip disable circuit 1500 of the LSB chip 1100 outputs the select signal CHIPslt of a logic high level. This maintains the mode reset signal nRSTmode from the circuit 1400 to be a logic level low. Therefore, the LSB chip 1100 performs its normal read operation. That is, a row of memory cell array 210 is selected by the X-DEC 220 in accordance with the loaded X-address, and the selected row is driven by a read voltage (that is, a word line voltage) from the control logic and high voltage generator 290. The page buffer circuit 230 senses data from the memory cell array 210 through columns under the control of the control logic and high voltage generator 290, and data thus sensed is transferred to the data input/output buffer circuit 250 via the Y-Gating 240 in accordance with the loaded Y-address.

On the other hand, when the MSB address signal Ai is at a logic low level, the chip disable circuit 1500 of the MSB chip 1200 outputs the select signal CHIPslt of a logic low level. This forces the mode reset signal nRSTmode from the mode-reset circuit 1400 to be pulsed. Accordingly, the activated master signal READ is inactivated by the mode reset signal nRSTmode thus pulsed (that is, the command register 280 is reset so as to disable the activated master signal). Therefore, the above-mentioned sensing operation is not performed. Furthermore, the data input/output buffer circuit 250 is disabled by the select signal CHIPslt of a logic low level.

During program and erase operations of the dual-chip package according to the first embodiment, enable and disable (selecting and unselecting) operation for the LSB and MSB chips is identical to the above-described read operation. Thus, description thereof is omitted.

According to the first embodiment of the present invention, the option pad PD1 of the LSB chip 1100 is coupled to a package pin receiving a ground voltage, and the option pad PD2 of the MSB chip 1200 is coupled to a package pin receiving a power supply voltage. As described above, in accordance with a logic state of the MSB address signal Ai, one of the LSB and MSB chips 1100 and 1200 is selected (or enabled) by means of a corresponding chip disable circuit 1500. Also, the other chip is unselected (or disabled) by means of a corresponding chip disable circuit 1500.

In forming the dual-chip package 1000, first, two chips 1100 and 1200 encapsulated in the package 1000 are fabricated on the same wafer so as to have the same type, for example, pad layout, capacity, address coding scheme, etc. Then, the option pads PD1 and PD2 provided on the LSB and MSB chips are bonded to package pins with each receiving either the ground voltage or the power supply voltage. Therefore, since the LSB and MSB chips 1100 and 1200 are distinguished from one another at the package level, packaging of the LSB and MSB chips 1100 and 1200 is greatly simplified.

Figure 7:
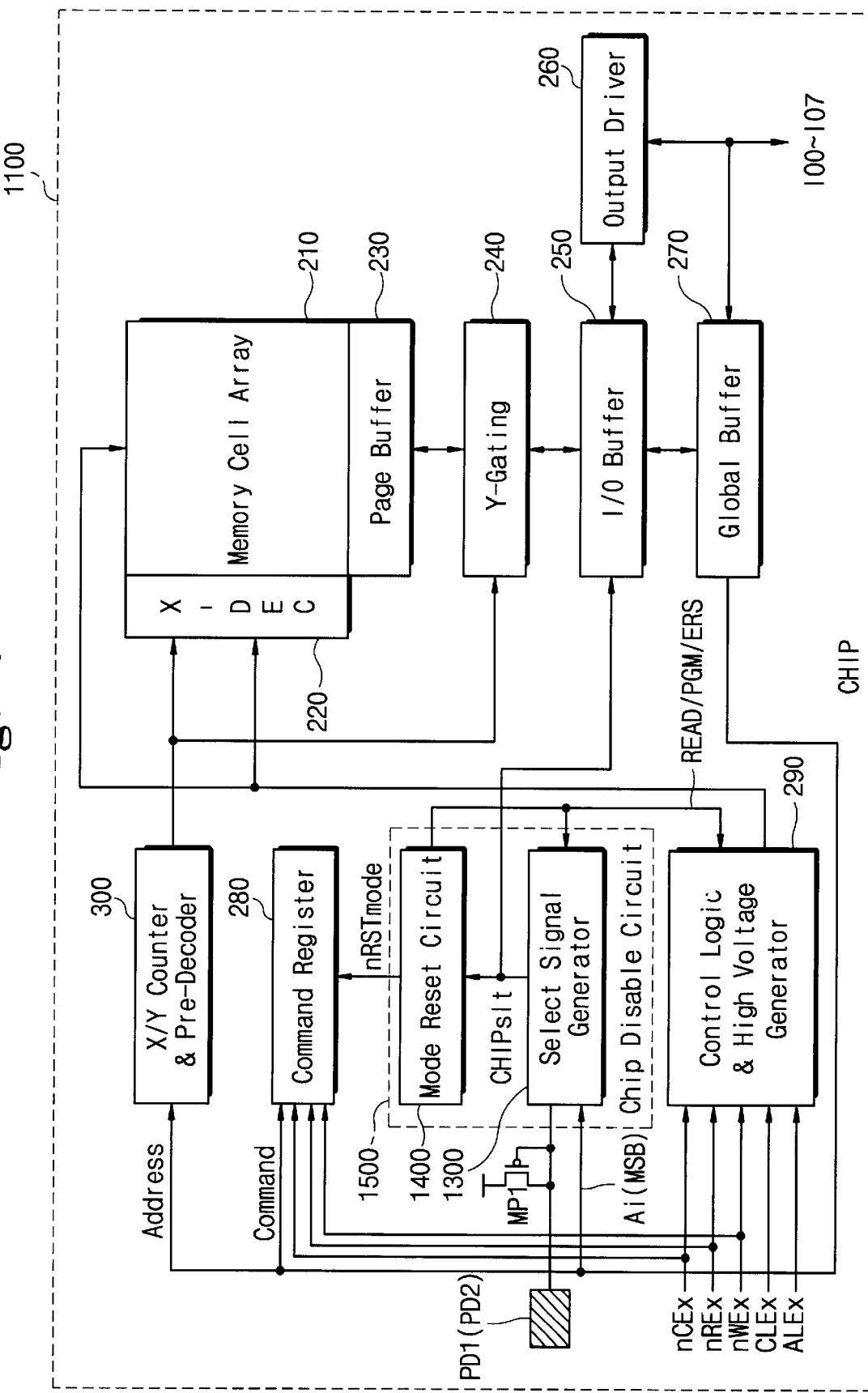
FIG. 7 is a block diagram of a flash memory device corresponding to one of the semiconductor integrated circuit chips of FIG. 3 according to a second embodiment of the present invention.

Referring to FIG. 7, a block diagram of a flash memory device according to the second embodiment of the present invention is illustrated. In FIG. 7, the second embodiment is identical to the first embodiment except that a pull-up transistor MP1 coupled between a power supply voltage and a corresponding option pad PD1 (or PD2) is further provided in each of the memory devices 1100 and 1200. Herein, the driving capability of the pull-up transistor NP1 may become low. In FIG. 7, the constituent components that are identical to those of FIG. 4 are labeled with the same reference numbers.

Furthermore, in the second embodiment, during packaging, the option pad PD1 of the LSB chip 1100 is bonded to a package pin supplying the ground voltage and the option pad PD2 of the MSB chip 1200 is not bonded at all. Therefore, the voltage signal of the option pad PD1 is set to a logic low level via a package pin supplying a ground voltage (since driving capability of the pull-up transistor is very little), and the voltage signal of the option pad PD2 is set to a logic high level by means of the pull-up transistor MP1. Similar to the first embodiment, selecting and unselecting of the LSB and MSB chips 1100 and 1200 may be determined by means of the MSB address signal Ai. As a result, the second embodiment has the same performance and beneficial effect as the first embodiment.

During read, program and erase operations of the dual-chip package according to the second embodiment, enable and disable (selecting and unselecting) operation of the LSB and MSB chips is identical to the above-described first embodiment, and description thereof is thus omitted.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A package comprising at least two identical integrated circuit (IC) chips encapsulated in the package, wherein the IC chips include option pads that in operation are biased to different voltage levels so that the IC chips are distinguished at a package level, wherein the IC chips each comprise a semiconductor memory device of identical address coding scheme, wherein the semiconductor memory device comprises:

a memory cell array for storing data;

a command register for activating one of master signals each indicative of a read mode, a program mode and an erase mode in response to an externally applied command; and a chip disable circuit coupled to a corresponding option pad, for determining whether or not a corresponding semiconductor memory device is selected, and for resetting the command register so as to disable the activated master signal when the corresponding semiconductor memory device is unselected.

2. The package according to claim 1, wherein the different voltage levels are a power supply voltage level and a ground voltage level.

3. The package according to claim 1, wherein the chip disable circuit of the respective integrated circuit chips comprises:

a select signal generator coupled to a corresponding option pad, for generating a chip select signal in response to a voltage signal at the corresponding option pad and a most significant bit address signal from external to the package, the chip select signal indicating whether a corresponding integrated circuit chip is selected or not; and a mode reset circuit for generating a mode-reset pulse signal in response to the chip select signal and the activated master signal so that the command register is reset.

4. The package according to claim 3, wherein the semiconductor memory device corresponding to each of the integrated circuit chips further comprises a data input/output buffer circuit which inputs data to be programmed in the memory cell array and outputs data read out from the memory cell array, the data input/output buffer circuit disabled by a corresponding chip select signal when a corresponding semiconductor memory device is unselected.

5. The package according to claim 3, wherein the option pad corresponding to one of the integrated circuit chips is bonded to a package pin receiving a ground voltage, and the option pad corresponding to the other thereof is bonded to a package pin receiving a power supply voltage.

6. The package according to claim 3, wherein each of the integrated circuit chips further comprises a pull-up transistor coupled between a power supply voltage and a corresponding option pad.

7. The package according to claim 6, wherein the option pad corresponding to one of the integrated circuit chips is bonded to a package pin receiving a ground voltage, and the option pad corresponding to the other thereof is not bonded to a package pin.

8. A package having a plurality of pins, comprising:

a first integrated circuit (IC) chip having pads corresponding to the pins, and a second IC chip having pads corresponding to the pins, wherein the first and second IC chips each have an option pad, wherein the first and second IC chips comprise semiconductor memory devices of the same address coding schemes, each chip includes a memory cell array for storing data; a command register for activating one of master signals each indicative of a read mode, a program mode and an erase mode in response to an externally applied command; and a chip disable circuit coupled to a corresponding option pad, for determining whether or not a corresponding semiconductor memory device is selected, and for resetting the command register so as to disable the activated master signal when the corresponding semiconductor memory device is unselected; and wherein the option pad of one of the first and second integrated circuit chips is at a package level bonded to one of the pins supplying a high logic level and the option pad of the other thereof is at the package level bonded to one of the pins supplying a low logic level.

9. The package according to claim 8, wherein the chip disable circuit of each of the first and second (IC) chips comprises:

a select signal generator coupled to a corresponding option pad, for generating a chip select signal in response to a voltage signal at the corresponding option pad and a most significant bit address signal from the exterior, the chip select signal indicating whether a corresponding integrated circuit chip is selected or not; and a mode reset circuit for generating a mode reset pulse signal in response to the chip select signal and the activated master signal so that the command register is reset.

10. The package according to claim 8, wherein the semiconductor memory device corresponding to each of the IC chips further comprises a data input/output buffer circuit which inputs data to be programmed in the memory cell array and outputs data read out from the memory cell array, the data input/output buffer circuit disabled by a corresponding chip select signal when a corresponding semiconductor memory device is unselected.

11. A package having a plurality of pins, comprising:

a first integrated circuit (IC) chip having pads corresponding to the pins, respectively; and a second IC chip having pads corresponding to the pins, respectively, wherein the first and second IC chips each have an option pad, wherein the first and second integrated circuit chips comprise semiconductor memory devices of the same address coding schemes, each of which a memory cell array for storing data; a command register for activating one of master signals each indicative of a read mode, a program mode and an erase mode in response to an externally applied command; a chip disable circuit coupled to a corresponding option pad, for determining whether or not a corresponding semiconductor memory device is selected, to reset the command register so as to disable the activated master signal when the corresponding semiconductor memory device is unselected; and a pull-up transistor coupled between a high logic level and a corresponding option pad; and wherein the option pad of one of the first and second IC chips is at a package level bonded to one of the pins supplying a low logic level and the option pad of the other thereof is at the package level intended to a pin of the package.

12. The package according to claim 11, wherein the chip disable circuit of each of the first and second IC chips comprises:

a select signal generator coupled to a corresponding option pad, for generating a chip select signal in response to a voltage signal at the corresponding option and a most significant bit address signal from the exterior, the chip select signal indicating whether a corresponding integrated circuit chip is selected or not; and a mode reset circuit for generating a mode reset pulse signal in response to the chip select signal and the activated master signal so that the command register is reset.

13. The package according to claim 11, wherein the semiconductor memory device corresponding to each of the IC chips further comprises a data input/output buffer circuit which inputs data to be programmed in the memory cell array and outputs data read out from the memory cell array, the data input/output buffer circuit disabled by a corresponding chip select signal when a corresponding semiconductor memory device is unselected.

* * * * *

UNITED STATES PATENT AND TRADEMARK OFFICE
CERTIFICATE OF CORRECTION

PATENT NO. : 6,366,487 B1  Page 1 of 1
DATED : April 2, 2002
INVENTOR(S) : Yeon

It is certified that error appears in the above-identified patent and that said Letters Patent is hereby corrected as shown below:

<u>Title page, Item [54] and Column 1, lines 1 & 2,</u>
Title, "PLURALITY OF INTEGRATED CIRCUIT CHIPS" should read -- A PACKAGE FOR ENCAPSULATING A PLURALITY OF INTEGRATED CIRCUIT CHIPS --.

<u>Column 5,</u>
Line 29, "erase mode.," should read -- erase mode. --.

Signed and Sealed this

Twenty-sixth Day of November, 2002

Attest:

Attesting Officer

JAMES E. ROGAN
*Director of the United States Patent and Trademark Office*